(12) United States Patent
Ogiso (10) Patent No.: US 10,021,819 B2
(45) Date of Patent: Jul. 10, 2018

(54) PRINTED BOARD WORKING APPARATUS

(71) Applicant: YAMAHA HATSUDOKI KABUSHIKI KAISHA, Shizuoka (JP)

(72) Inventor: Takeshi Ogiso, Shizuoka (JP)

(73) Assignee: YAMAHA HATSUDOKI KABUSHIKI KAISHA, Shizuoka (JP)

(*) Notice: Subject to any disclaimer, the term of this patent is extended or adjusted under 35 U.S.C. 154(b) by 233 days.

(21) Appl. No.: 14/272,971

(22) Filed: May 8, 2014

(65) Prior Publication Data
US 2014/0345120 A1 Nov. 27, 2014

(30) Foreign Application Priority Data

May 22, 2013 (JP) ................................ 2013-107686

(51) Int. Cl.
*H05K 13/04* (2006.01)
*H05K 13/08* (2006.01)
(Continued)

(52) U.S. Cl.
CPC ........... *H05K 13/0413* (2013.01); *H05K 3/30* (2013.01); *H05K 3/303* (2013.01);
(Continued)

(58) Field of Classification Search
CPC ............... H05K 13/04; H05K 13/0404; H05K 13/0408; H05K 13/0413; H05K 13/0469;
(Continued)

(56) References Cited

U.S. PATENT DOCUMENTS 5,570,993 A * 11/1996 Onodera ............ H05K 13/0413
29/740
6,293,003 B1 * 9/2001 Sakurai .............. H05K 13/0408
29/740
(Continued)

FOREIGN PATENT DOCUMENTS

CN 101317502 A 12/2008
JP H09-205299 A 8/1997
(Continued)

OTHER PUBLICATIONS

Machine Language Translation of Japanese Patent Publication JP 2002-176291, Feb. 2016.*
(Continued)

*Primary Examiner* — A. Dexter Tugbang
(74) *Attorney, Agent, or Firm* — Studebaker & Brackett PC (57) ABSTRACT

A printed board working apparatus includes a transport device which transports a printed board in a horizontal direction, and a moving member which moves in a horizontal direction above the transport device. The printed board working apparatus includes a plurality of component attaching portions which are aligned in the installation direction and move together with the moving member. The printed board working apparatus also includes at least one working head which performs work on the printed board held by the transport device. The working head is attached to at least one component attaching portion out of the plurality of component attaching portions, and can change a position relative to the moving member in the installation direction. A region where the working head cannot perform work as the number of working heads increases is reduced.

7 Claims, 10 Drawing Sheets

(51) Int. Cl.
    *H05K 13/02* (2006.01)
    *H05K 13/00* (2006.01)
    *H05K 3/30* (2006.01)
    *B65G 47/91* (2006.01)

(52) U.S. Cl.
    CPC ....... *H05K 13/0053* (2013.01); *H05K 13/022* (2013.01); *H05K 13/04* (2013.01); *H05K 13/0404* (2013.01); *H05K 13/0408* (2013.01); *H05K 13/0469* (2013.01); *H05K 13/08* (2013.01); *B65G 47/91* (2013.01); *Y10T 29/53022* (2015.01); *Y10T 29/53174* (2015.01); *Y10T 29/53191* (2015.01); *Y10T 29/53261* (2015.01)

(58) Field of Classification Search
    CPC .......... H05K 13/08; H05K 3/30; H05K 3/303; H05K 13/0053; H05K 13/022; Y10T 29/53022; Y10T 29/53174; Y10T 29/53191; Y10T 29/53261; B65G 47/91
    See application file for complete search history.

(56) References Cited

U.S. PATENT DOCUMENTS

| | | | | |
|---|---|---|---|---|
| 7,290,327 | B2* | 11/2007 | Nakano | H05K 13/08 29/739 |
| 2002/0153735 | A1* | 10/2002 | Kress | B65G 47/91 294/87.1 |
| 2007/0124922 | A1* | 6/2007 | Kawasumi | H05K 13/0408 29/739 |
| 2009/0125141 | A1 | 5/2009 | Noda et al. | |
| 2012/0036711 | A1* | 2/2012 | Ban | Y10T 29/53191 29/832 |

FOREIGN PATENT DOCUMENTS

| | | |
|---|---|---|
| JP | 2001-326500 A | 11/2001 |
| JP | 2002-176291 A | 6/2002 |
| JP | 3524212 B2 | 2/2004 |
| JP | 2008021822 A * | 1/2008 |

OTHER PUBLICATIONS

An Office Action issued by the Korean Patent Office dated Jun. 15, 2015, which corresponds to Korean Patent Application No. 10-2014-0061592 and is related to U.S. Appl. No. 14/272,971.

The extended European search report issued by the European Patent Office on Jul. 20, 2015, which corresponds to European Patent Application No. 14001504.1-1905 and is related to U.S. Appl. No. 14/272,971.

The first Office Action issued by the Chinese Patent Office dated Aug. 24, 2016, which corresponds to Chinese Patent Application No. 201410218755.9 and is related to U.S. Appl. No. 14/272,971.

An Office Action; "Notice of Reasons for Rejection," issued by the Japanese Patent Office dated Oct. 4, 2016, which corresponds to Japanese Patent Application No. 2013-107686 and is related to U.S. Appl. No. 14/272,971.

* cited by examiner

PRINTED BOARD WORKING APPARATUS

CROSS REFERENCE TO RELATED APPLICATIONS

This application claims benefit of priority to Japanese Patent Application No. 2013-107686 filed on May 22, 2013, the entire content of which is incorporated herein by reference.

TECHNICAL FIELD

The present technical field relates to a printed board working apparatus whose working target is a printed board.

BACKGROUND

A printed board becomes a finished product after mounting electronic components on it. An electronic component mounting apparatus mounts electronic components on a printed board. On the printed board on which electronic components are to be mounted, a dispenser applies in advance a cream solder, adhesive, or the like. Printed board working apparatuses such as the electronic component mounting apparatus and dispenser can be equipped with a plurality of working heads. The working head of the electronic component mounting apparatus is a suction head including a suction nozzle. The working head of the dispenser is a coating head including a coating nozzle.

A conventional dispenser including a plurality of coating heads is described in, e.g., Japanese Patent No. 3524212. The dispenser disclosed in Japanese Patent No. 3524212 includes a transport device which transports a printed board, and a head unit which moves horizontally above the transport device.

The head unit includes a moving member which moves above the transport device, and a plurality of coating heads arranged on the moving member. Each coating head includes a coating nozzle for applying a coating solution to a printed board. The plurality of coating heads are fixed to the moving member while they are aligned in the transport direction of the transport device.

The head unit moves in the transport direction of the transport device and a horizontal direction perpendicular to the transport direction. By moving the moving member, the coating head is positioned at a target coating position on a printed board. The coating head moves down from the moving member to apply the coating solution from the coating nozzle to the printed board.

The conventional printed board working apparatus including the dispenser disclosed in Japanese Patent No. 3524212 is sometimes operated in a state in which the number of working heads to be used is smaller than a maximum value. The maximum value is the total number of working heads mountable on one head unit. In the printed board working apparatus having a small number of working heads, a working head is added when the number of types of coating solutions is increased or a coating nozzle of a different type becomes necessary.

Figure 15:
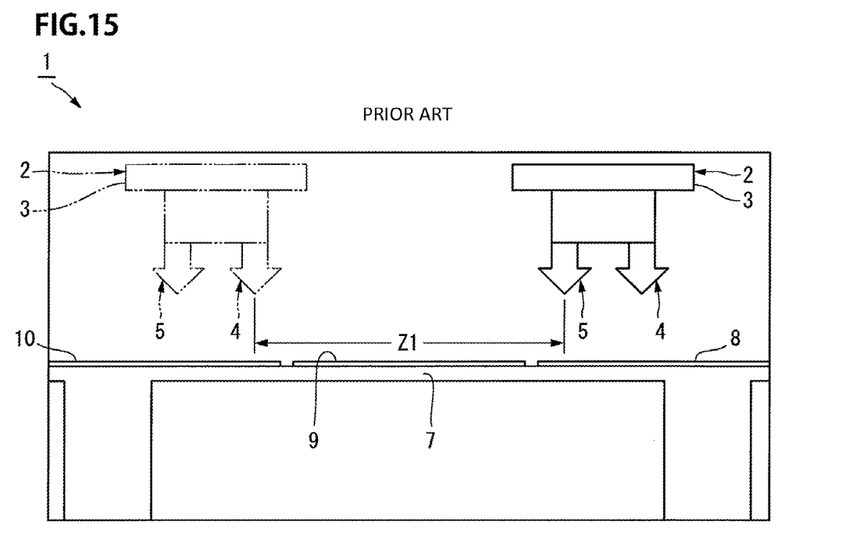
FIG. 15 is a front view showing a conventional printed board working apparatus before adding a working head.
Figure 16:
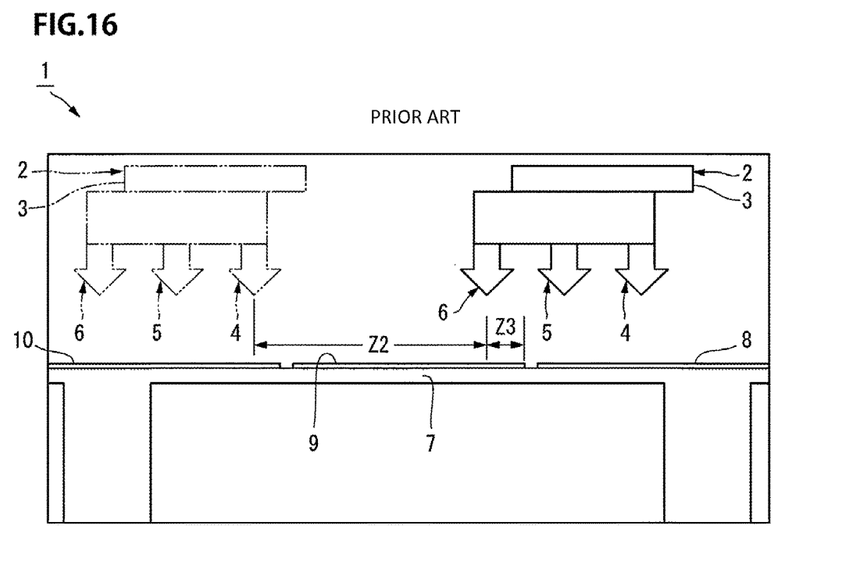
FIG. 16 is a front view showing the conventional printed board working apparatus after adding a working head.

In the above-described conventional printed board working apparatus, the following problem arises from an increase in the number of working heads. This problem will be explained with reference to FIGS. 15 and 16. A head unit 2 of a working apparatus 1 shown in FIG. 15 includes a moving member 3, first working head 4, and second working head 5. A head unit 2 of a working apparatus 1 shown in FIG. 16 includes a moving member 3, first working head 4, second working head 5, and third working head 6. In FIGS. 15 and 16, reference numeral 7 denotes a transport device; and 8 to 10, printed boards.

A moving device (not shown) supports the moving member 3. The moving device drives the moving member 3 to move above the transport device between the first position indicated by a solid line in each of FIGS. 15 and 16 and the second position indicated by a chain double-dashed line. The movable region of the moving member cannot be changed.

In general, the printed board 8 before work, the printed board 9 to undergo work, and the printed board 10 having undergone work are mounted on the transport device 7. The transport device 7 transports the printed board from right to left in FIGS. 15 and 16.

For convenience, the working apparatus 1 shown in FIG. 15 is illustrated in a state in which the printed board 9 to undergo work falls within a region Z1 where all the working heads 4 and 5 can perform work.

When one working head 6 is added to the left side of the second working head 5 in the working apparatus 1 shown in FIG. 15, the working apparatus 1 changes to the state shown in FIG. 16. In the working apparatus 1 shown in FIG. 16, a region Z2 where all the working heads 4 to 6 can perform work is positioned locally on the downstream side in the transport direction from the center of the working apparatus 1. This generates a region Z3 where none of the working heads can perform work on the printed board 9 to undergo work.

That is, in the conventional working apparatus, as the number of working heads increases, the region where work can be performed using all working heads becomes narrower.

SUMMARY

The present invention has been made to solve the above problems, and has as its object to reduce a region where none of working heads can perform work owing to an increase in the number of working heads.

To achieve the above object, according to the present invention, there is provided a printed board working apparatus comprising a transport device which transports a printed board in a horizontal direction, a moving member which moves in a horizontal direction above the transport device, a plurality of component attaching portions which are aligned in an installation direction that is one of a transport direction of the transport device and a horizontal direction perpendicular to the transport direction, and which move together with the moving member, and at least one working head which performs work on the printed board held by the transport device, wherein one of a form in which the plurality of component attaching portions are arranged on the moving member and a form in which the plurality of component attaching portions are arranged on a base member moving together with the moving member is adopted, and the working head is attached to at least one component attaching portion out of the plurality of component attaching portions, and can change a position relative to the moving member in the installation direction.

DETAILED DESCRIPTION

First Embodiment

An embodiment of a printed board working apparatus according to the present invention will be described in detail below with reference to FIGS. 1 to 12. The first embodiment will exemplify a case in which the present invention is applied to a dispenser.

Figure 1:
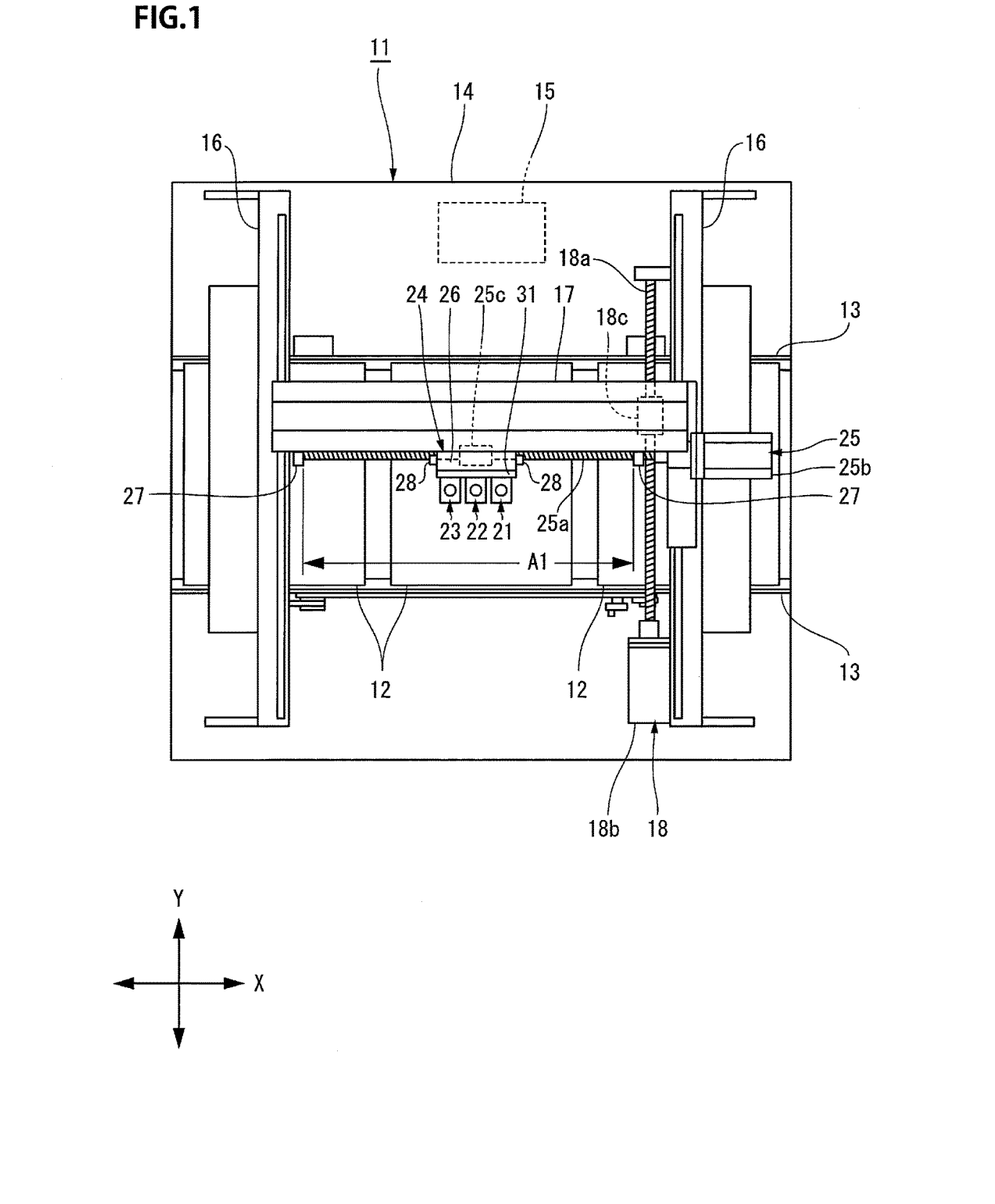
FIG. 1 is a plan view showing a dispenser according to the first embodiment.

A dispenser 11 shown in FIG. 1 is used to apply a coating solution (not shown) such as an adhesive or cream solder to a printed board 12. Each printed board 12 is mounted on a pair of conveyors 13 crossing the dispenser 11 in the left-and-right direction in FIG. 1. The conveyors 13 transport the printed board 12 in the left-and-right direction, and is arranged on a base 14 of the dispenser 11. In the following description, the transport direction of the conveyors 13 will be simply referred to as the X direction, and a horizontal direction perpendicular to the X direction will be referred to as the Y direction. In the embodiment, the conveyors 13 constitute a "transport device" in the present invention.

After the conveyors 13 transport the printed board 12 to the center (center in the X direction) of the base 14, a board holding device (not shown) holds the printed board 12 so that the printed board 12 cannot move. A control device 15 arranged below the base 14 controls the operation of the conveyors 13. The printed boards 12 shown in FIG. 1 are arranged respectively at a working position which is the center in the transport direction, an unloading standby position on the downstream side of the working position in the transport direction, and a working standby position on the upstream side of the working position in the transport direction.

Fixed rails 16 are arranged at the two ends of the base 14 in the X direction and extend in the Y direction above the conveyors 13. The fixed rails 16 support a head support member 17 extending in the X direction, to be freely movable in the Y direction. A Y direction driving device 18 for driving the head support member 17 is arranged on one fixed rail 16. The Y direction driving device 18 includes a ball screw shaft 18a extending in the Y direction, a motor 18b which drives the ball screw shaft 18a, and a ball screw nut 18c which is fixed to the head support member 17 while being screwed with the ball screw shaft 18a. The control device 15 controls the operation of the Y direction driving device 18.

The head support member 17 includes a head unit 24 capable of mounting first to third coating heads 21 to 23, and an X direction driving device 25 for driving the head unit 24 (to be described later).

The head unit 24 is constituted by a moving member 26 which is supported by the head support member 17 to be freely movable in the X direction, and a plurality of components (to be described later) arranged on the moving member 26.

The X direction driving device 25 includes a ball screw shaft 25a extending in the X direction, a motor 25b which drives the ball screw shaft 25a, and a ball screw nut 25c which is fixed to the moving member 26 while being screwed with the ball screw shaft 25a. The control device 15 controls the operation of the X direction driving device 25.

The Y direction driving device 18 drives the head support member 17 to move in the Y direction, thereby moving the head unit 24 in the Y direction.

Also, the X direction driving device 25 drives the head unit 24 to move in the X direction. Stoppers 27 attached to the head support member 17 regulate the moving amount of the head unit 24 in the X direction. The stoppers 27 are arranged at positions at which abutment members 28 arranged on the moving member 26 of the head unit 24 abut against the stoppers 27. That is, the moving member 26 moves within a predetermined first region A1 in the X direction.

Figure 8:
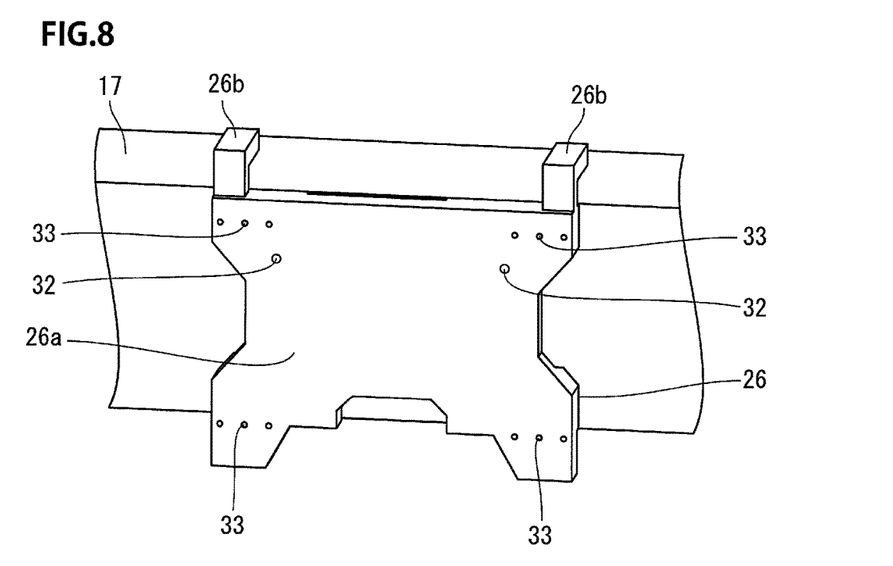
FIG. 8 is an enlarged perspective view showing a moving member.
Figure 9:
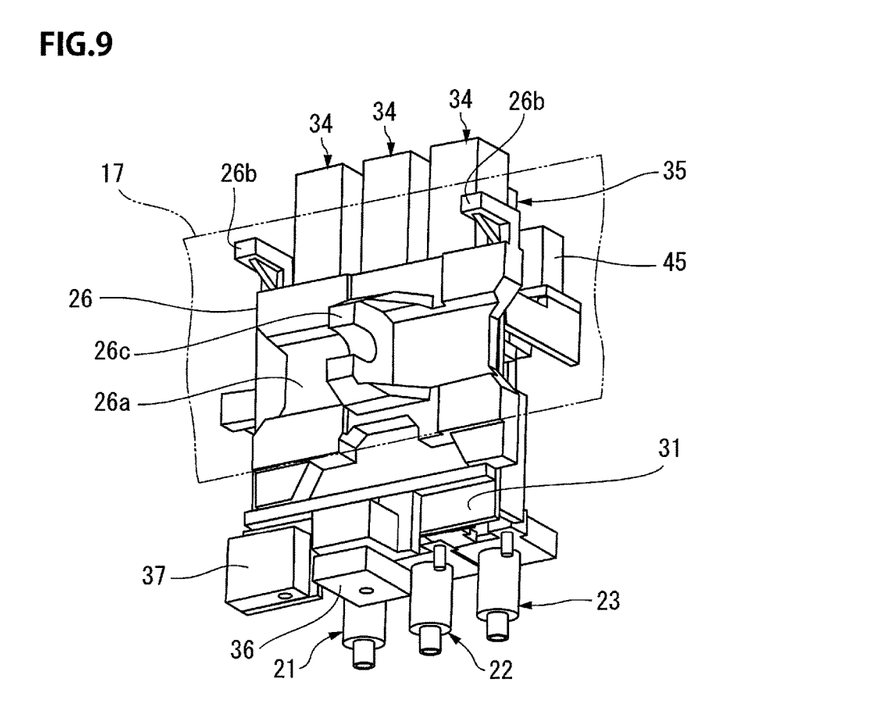
FIG. 9 is a perspective view of the head unit when viewed from the head support member side.

As shown in FIGS. 8 and 9, the moving member 26 includes a plate-like main body 26a, arms 26b arranged at the upper end of the main body 26a, and a bracket 26c arranged on the rear surface of the main body 26a. The main body 26a is formed into a plate shape extending in the X direction and vertical direction along the head support member 17.

The front surface of the main body 26a is formed to be flat. As shown in FIG. 8, threaded holes 32 for attaching a base member 31 (see FIGS. 2 to 7: to be described later), and a plurality of positioning holes 33 are formed in the front surface.

The positioning holes 33 are formed at each of the four corners of the main body 26a. The plurality of holes 33 formed at each corner of the main body 26a are aligned at a predetermined interval in the X direction. This interval is ½ of the interval at which the first to third coating heads 21 to 23 (to be described later) are aligned.

The head support member 17 supports the arms 26b to be freely movable in the X direction.

The ball screw nut 25c of the X direction driving device 25 is attached to the bracket 26c.

As shown in FIGS. 2 to 4 and 7 to 9, a plurality of components supported by the moving member 26 are the base member 31, the first to third coating heads 21 to 23, elevating devices 34, a rotation device 35, an image sensing device 36, and a measurement device 37.

Figure 2:
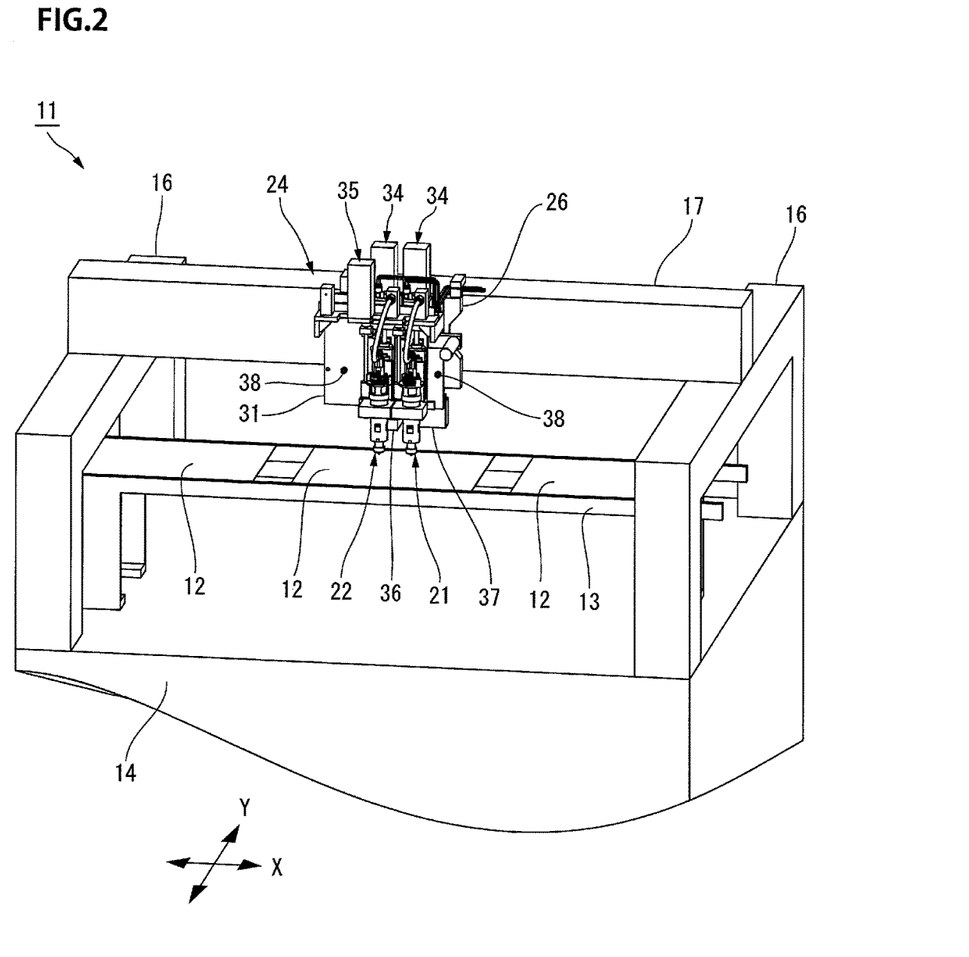
FIG. 2 is a perspective view showing the main part of the dispenser including two coating heads, in which only fixed

As shown in FIG. 2, the base member 31 is formed into a plate shape, and is detachably attached to the front surface of the moving member 26 by attaching bolts 38. Pins (see FIG. 4) are arranged at portions of the rear surface of the base member 31 that face the four corners of the moving member 26. The pins 39 are fitted in the positioning holes 33 (see FIG. 8) of the moving member 26.

Each pin 39 is fitted in one of the positioning holes 33 aligned in the X direction at each corner of the moving member 26. When the pin 39 is fitted in a different hole 33, the X position of the base member 31 with respect to the moving member 26 is changed. That is, the base member 31 is attached to the moving member 26 so that the attaching position is changeable in the X direction. The X position of the base member 31 with respect to the moving member 26 is determined based on a predetermined rule, which will be described later.

Figure 3:
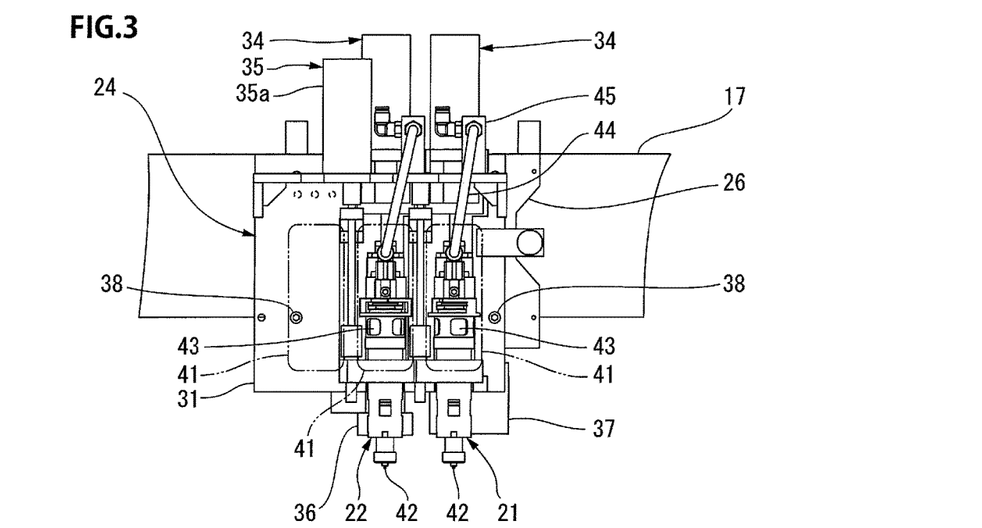
FIG. 3 is a front view showing the head unit including the two coating heads.

As shown in FIG. 3, a plurality of component attaching portions 41 are arranged on the front surface of the base member 31. The first to third coating heads 21 to 23 (to be described later) are attached to the component attaching portions 41. The transport direction (X direction) of the conveyors 13 is defined as an installation direction, and the component attaching portions 41 are aligned in the installation direction. The component attaching portions 41 move together with the moving member 26.

The component attaching portions 41 according to the embodiment are arranged at three portions of the base member 31 so that the first to third coating heads 21 to 23 can be attached to the base member 31. The first coating head 21 and second coating head 22 are attached to the base member 31 shown in FIGS. 2 and 3, details of which will be described later. Thus, there is an unused component attaching portion 41. In the embodiment, the base member 31 constitutes a "member which moves together with a moving member" in the present invention. The first to third coating heads 21 to 23 are attached to the base member 31 shown in FIGS. 5 to 9.

Figure 6:
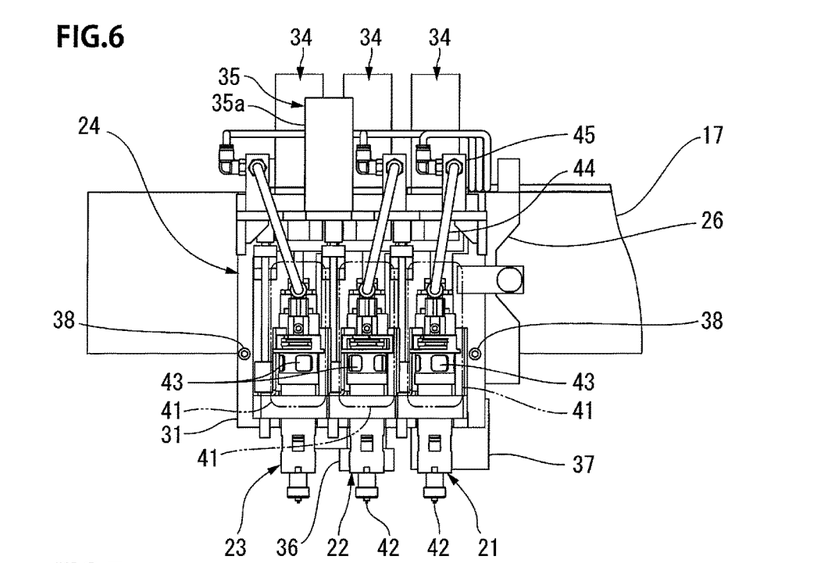
FIG. 6 is a front view showing the head unit including the three coating heads.

For example, as shown in FIG. 6, each of the first to third coating heads 21 to 23 includes a coating nozzle 42 positioned at the lower end, and a syringe 43 positioned above the coating nozzle 42. The first to third coating heads 21 to 23 are attached to the component attaching portions 41 of the base member 31, respectively. In other words, the plurality of coating heads 21 to 23 are aligned in the installation direction of the component attaching portions 41. In the embodiment, the first to third coating heads 21 to 23 constitute "working heads" in the present invention.

The syringe 43 stores a coating solution. The upper end of the syringe 43 is connected to a switching valve 45 via a hose 44. The switching valve 45 is connected to an air supply source (not shown). The air supply source supplies compressed air.

The coating nozzle 42 downwardly supplies the coating solution. When pressurized air is supplied from the air supply source to the syringe 43, the coating solution is pushed out from the syringe 43 and discharged from the coating nozzle 42.

The elevating devices 34 move the first to third coating heads 21 to 23 up and down, respectively. The elevating devices 34 are attached to the base member 31.

The rotation device 35 rotates all the coating heads 21 to 23 by power of a motor 35a about a vertical axis as a center. The power of the motor 35a is transmitted to the first to third coating heads 21 to 23 via a belt (not shown). The rotation device 35 is attached to the base member 31. The control device 15 controls the operations of the rotation device 35 and elevating devices 34.

The image sensing device 36 senses the printed board 12 and a coating solution applied to the printed board 12 from above them. As shown in FIG. 9, the image sensing device 36 is attached to the lower end of the base member 31. The image sensing device 36 sends image data obtained by image sensing to the control device 15. The control device 15 analyzes the image data and measures, e.g., the position, shape, and dimensions of the coating solution applied to the printed board 12.

The measurement device 37 measures the height of the printed board 12. The measurement device 37 is attached to a position spaced apart from the image sensing device 36 in the X direction at the lower end of the base member 31. The measurement device 37 according to the embodiment is constituted by a laser measurement device which irradiates the printed board 12 with a laser beam.

To apply a coating solution to the printed board 12 in the dispenser 11 having this arrangement, the printed board 12 is held at a working position by the conveyors 13. Then, the head unit 24 moves horizontally above the base 14. The coating nozzle 42 is positioned above the target coating position on the printed board 12. The elevating device 34 drives, e.g., one of the first to third coating heads 21 to 23 to move down. Along with this downward movement, a coating solution supplied from the coating nozzle 42 is applied to the printed board 12.

Figure 4:
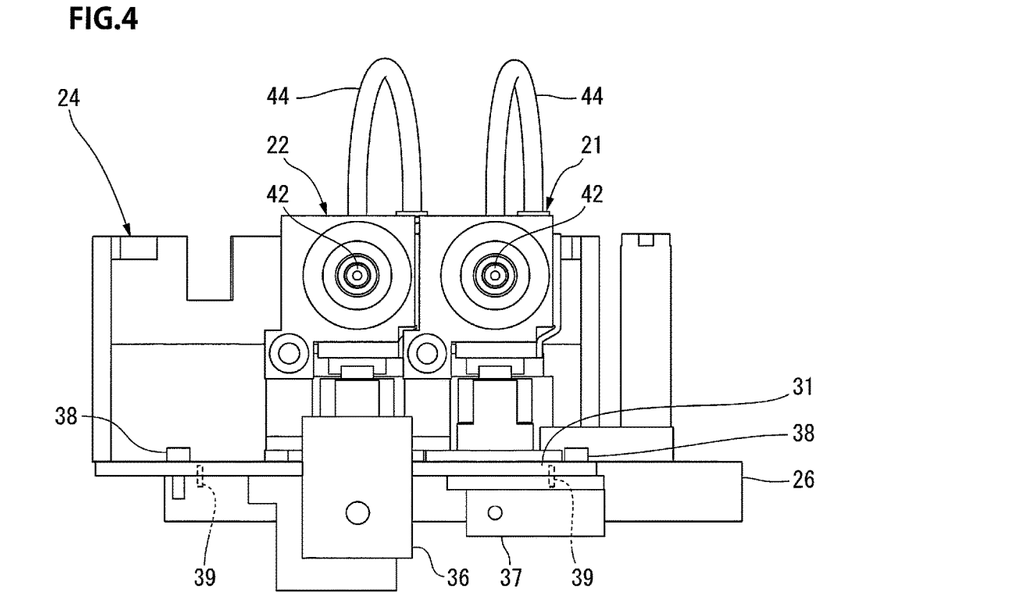
FIG. 4 is a bottom view showing the head unit including the two coating heads.
Figure 5:
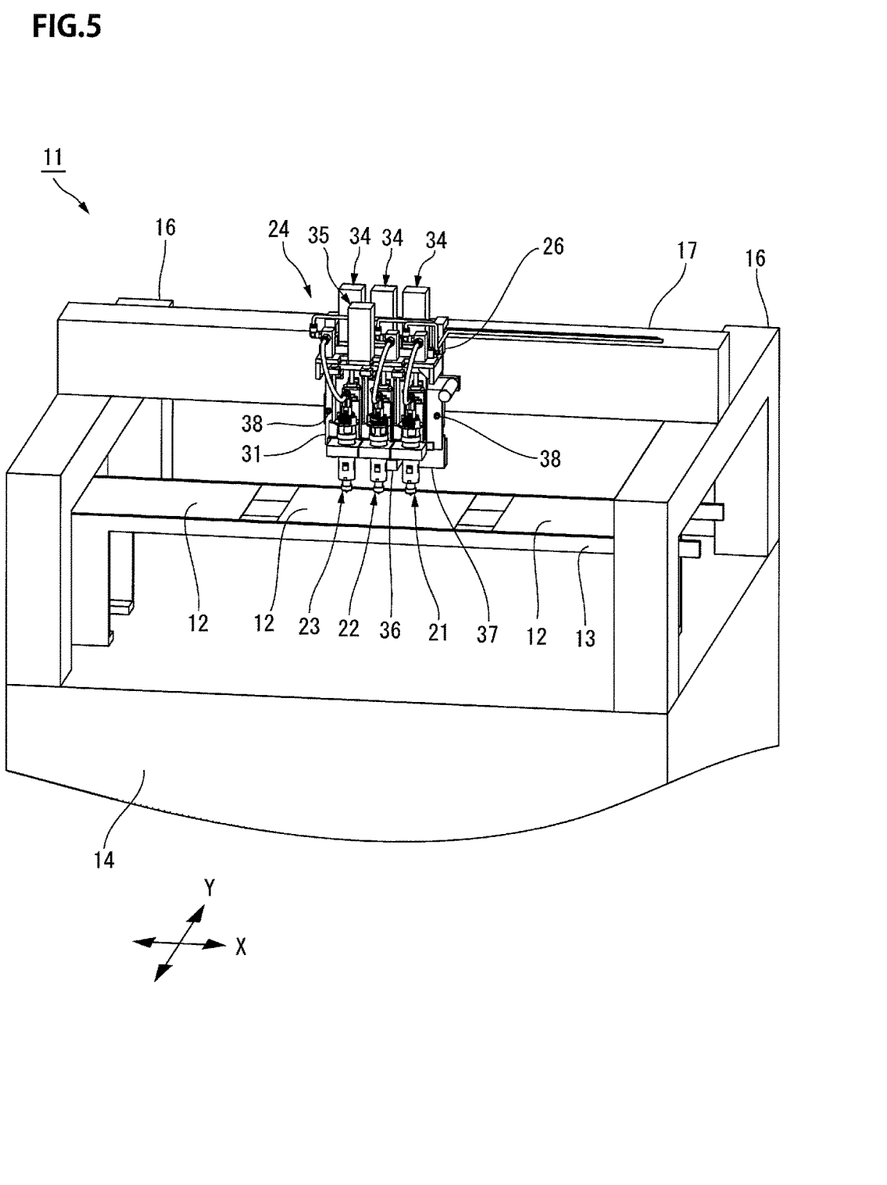
FIG. 5 is a perspective view showing the main part of the dispenser including three coating heads, in which only the fixed rails and head support member are illustrated as components for supporting the head unit, and the remaining components are not illustrated.
Figure 7:
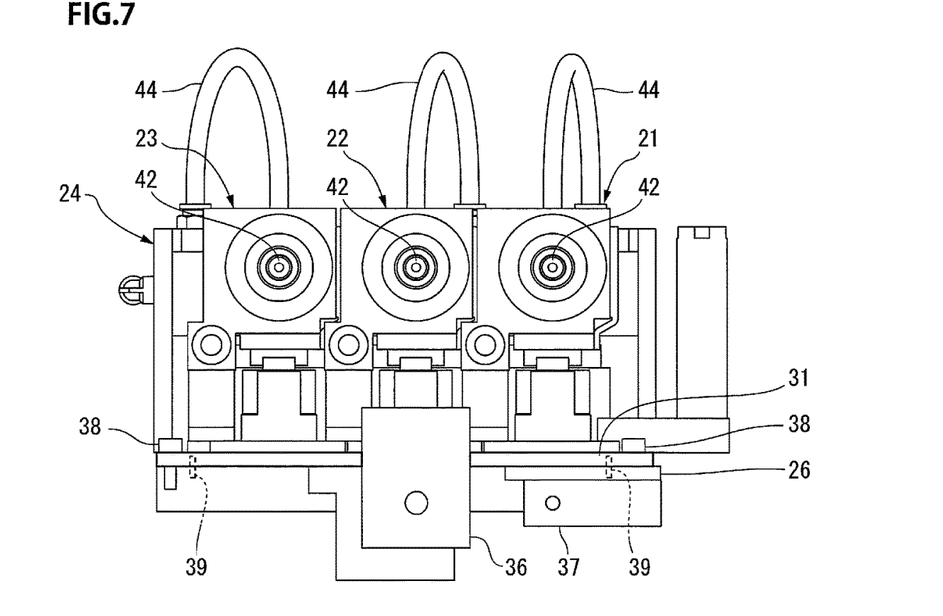
FIG. 7 is a bottom view showing the head unit including the three coating heads.

In the dispenser 11 according to the embodiment, for example, when the number of types of coating solutions to be used is increased or a coating nozzle 42 of a different form becomes necessary in a state in which the two coating heads 21 and 22 are attached, as shown in FIGS. 2 to 4, the third coating head 23 is added, as shown in FIGS. 5 to 7.

A coating head is added by newly attaching it to an unused component attaching portion 41. When the third coating head 23 is attached to the unused component attaching portion 41, the three coating heads 21 to 23 are aligned in the installation direction of the component attaching portions 41, as shown in FIGS. 7 to 9. At the time of addition, the rotation device 35 is connected to the third coating head 23.

When the number of coating heads attached to the base member 31 is changed, the attaching position of the base member 31 with respect to the moving member 26 is changed based on a predetermined rule. The attaching position of the base member 31 is changed in a case in which the number of coating heads used to apply a coating solution is changed even if the number of coating heads attached to the base member 31 does not change. The "case in which the number of coating heads is changed" includes both a case in which the number of coating heads is increased and a case in which the number of coating heads is decreased.

Figure 10:
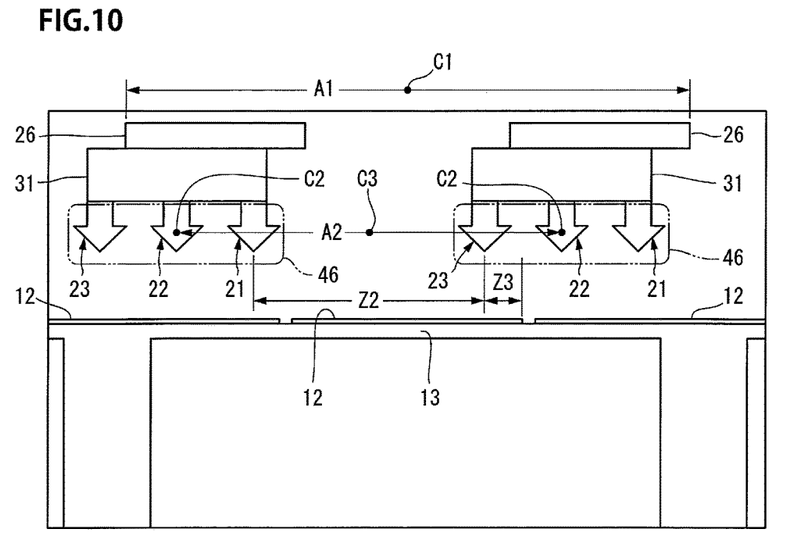
FIG. 10 is a front view showing the arrangement of the dispenser before changing the base member attaching position.

The rule when changing the attaching position of the base member 31 will be explained with reference to FIGS. 10 and 11. This rule is made based on the following matters as preconditions.

The moving member 26 moves within the predetermined first region A1 in the installation direction of the component attaching portions 41 (first precondition).

The center of the first region A1 in the installation direction of the component attaching portions 41 is defined as a movable region center C1 (second precondition).

One or a plurality of coating heads 21 to 23 used to apply a coating solution constitute a virtual working apparatus main body 46 (third precondition).

The center of the working apparatus main body 46 in the installation direction of the component attaching portions 41 is defined as a working center C2 (fourth precondition).

The region where the working center C2 moves when the moving member 26 moves from one end to the other end of the first region A1 is defined as a second region A2 (fifth precondition).

The center of the second region A2 in the installation direction of the component attaching portions 41 is defined as a moving center C3 (sixth precondition).

Figure 11:
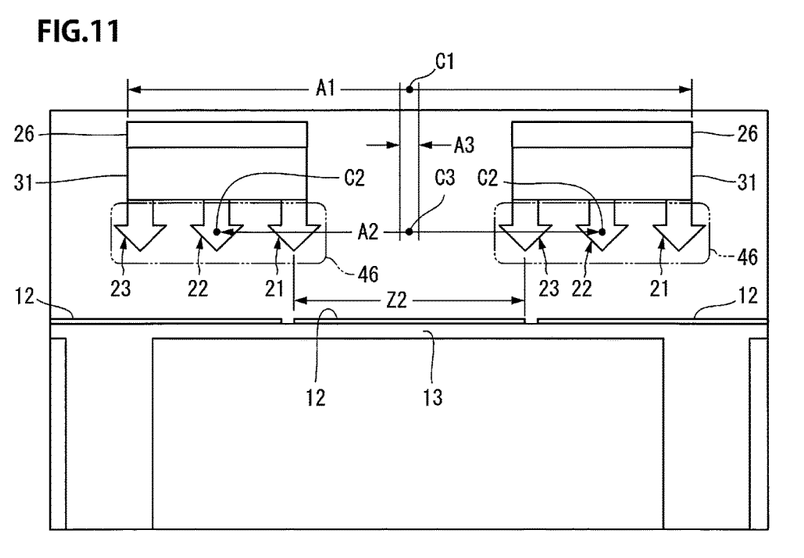
FIG. 11 is a front view showing the arrangement of the dispenser after changing the base member attaching position.

The rule when changing the attaching position of the base member 31 is that the moving center C3 is positioned within an allowable range A3 of predetermined dimensions including the movable region center C1 in the installation direction, as shown in FIG. 11.

A case in which this rule is not applied, that is, a conventional case will be explained with reference to FIG. 10. FIG. 10 shows a state in which the third coating head 23 is added adjacently to, e.g., the second coating head 22 out of the first and second coating heads 21 and 22 shown in FIGS. 2 to 4. In this case, a region Z2 where all the first to third coating heads 21 to 23 can perform coating is localized to the left in FIG. 10. As a result, a region Z3 where work cannot be performed is generated at the right end of the printed board 12 at the center. In this manner, when the third coating head 23 is added, the moving center C3 greatly moves apart from the movable region center C1 in the installation direction.

In this case, by applying the above-described rule, the moving center C3 is located at the same position as the movable region center C1 or near the movable region center C1 within the allowable range A3, as shown in FIG. 11. Based on this rule, the attaching positions of the first to third coating heads 21 to 23 shown in FIG. 11 are changed rightward from those shown in FIG. 10. That is, when adding a coating head to be used, the attaching positions of the first to third coating heads 21 to 23 are changed in a direction in which the region (region Z3 in FIG. 10) where none of coating heads can perform work is reduced.

In the embodiment, the attaching position of the base member 31 is changed when changing the positions of the respective coating heads 21 to 23. In this case, an operator (not shown) changes the attaching position of the base member 31 according to the following procedures. First, the operator dismounts the base member 31 from the moving member 26. Then, the operator moves right the base member 31 and attaches it to the moving member 26 in this state. This positioning is performed using the pins 39 of the base member 31 and the positioning holes 33 of the moving member 26.

The positioning holes 33 are formed at positions associated with the number of coating heads to be used. By inserting the pins 39 into the positioning holes 33, the base member 31 is attached to an optimum attaching position corresponding to the number of coating heads to be used. The optimum position is a position based on the above-described rule, and is a position at which the moving center C3 is located at the same position as the movable region center C1 or near the movable region center C1 in the installation direction. The base member 31 is therefore attached to a position based on the above-described rule by inserting the pins 39 into the positioning holes 33. When the attaching position of the base member 31 is changed, the attaching positions of the image sensing device 36 and measurement device 37 on the base member 31 with respect to the moving member 26 are also changed.

The above-described rule is applied even to a case in which the number of coating heads attached to the base member 31 is one, and a case in which the number of coating heads used to apply a coating solution, out of a plurality of coating heads attached to the base member 31, is one.

Figure 12:
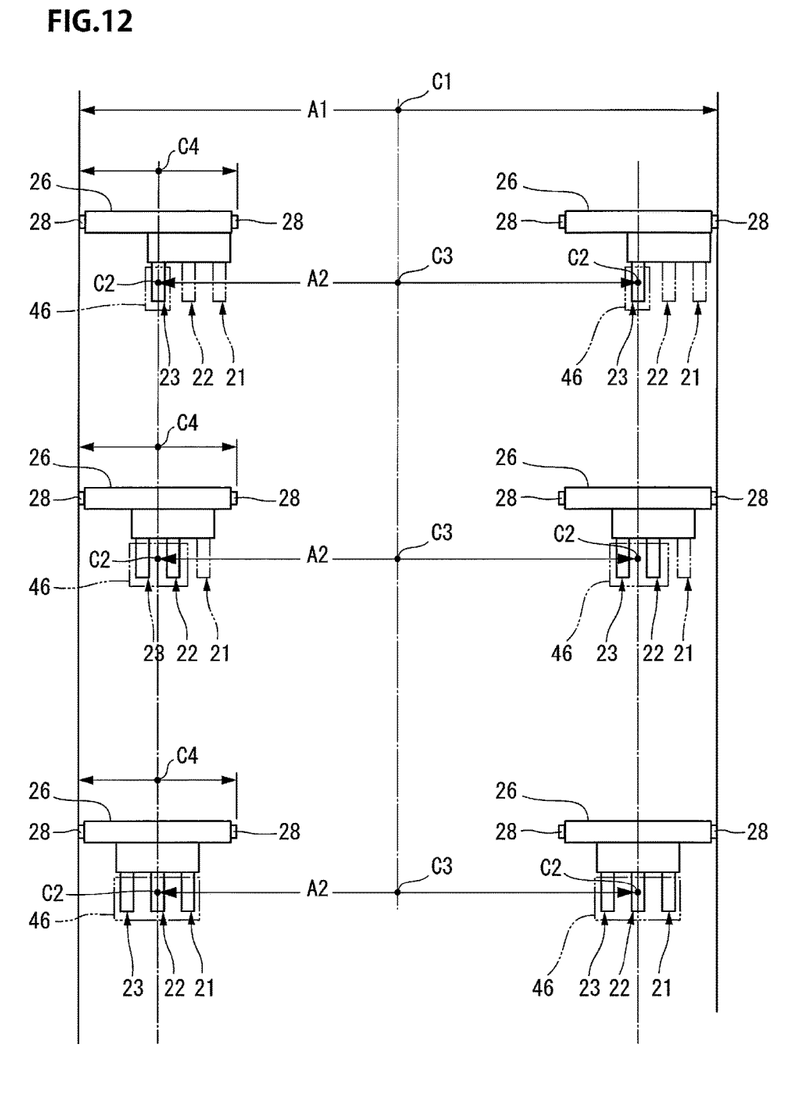
FIG. 12 is a schematic view for explaining the relationship between the number of coating heads and the base member attaching position, in which the head unit is viewed from the front.

When the moving center C3 coincides with the movable region center C1 in the installation direction of the component attaching portions 41, the working center C2 and a center C4 of the moving member 26 are located at the same position in the installation direction of the component attaching portions 41, as shown in FIG. 12. The center C4 of the moving member 26 is a center position between the pair of abutment members 28 arranged at the two ends of the moving member 26 in the X direction.

In FIG. 12, coating heads indicated by solid lines are coating heads which are attached to the base member 31 and used to apply a coating solution. In FIG. 12, coating heads indicated by chain double-dashed lines are a coating head which is detached from the base member 31, and a coating head which is attached to the base member 31 but is not used to apply a coating solution.

As is apparent from FIG. 12, by changing the attaching position of a coating head based on the above-mentioned rule, the moving center C3 coincides with the movable region center C1 in the installation direction of the component attaching portions 41 regardless of the number of coating heads to be used.

Accordingly, as shown in FIG. 11, the center of the conveyors 13 in the transport direction falls within the region Z2 where the first to third coating heads 21 to 23 can apply coating solutions. The length of the printed board 12 in the transport direction shown in FIG. 11 is formed to be almost equal to the length of the region Z2 in the transport direction. By adopting the form shown in FIG. 11, the three printed boards 12 can be set on the conveyors 13 without extending the conveyors 13 toward the loading or unloading side.

In the dispenser 11 according to the embodiment, the attaching positions of the first to third coating heads 21 to 23 with respect to the moving member 26 can be changed in the installation direction of the component attaching portions 41. The embodiment can therefore provide a printed board working apparatus capable of coating in a region where no coating head can perform coating before the attaching position of the coating head is changed.

The moving member 26 according to the embodiment moves within the predetermined first region A1 in the installation direction of the component attaching portions 41. In the embodiment, all coating heads used to apply a coating solution constitute the working apparatus main body 46. The center of the working apparatus main body 46 in the installation direction of the component attaching portions 41 is defined as the working center C2. The region where the working center C2 moves as the moving member 26 moves from one end to the other end of the first region A1 is defined as the second region A2. The center of the second region A2 in the installation direction of the component attaching portions 41 is positioned within the allowable range A3 of predetermined dimensions including the center of the first region A1 in the installation direction of the component attaching portions 41.

For this reason, even if the number of coating heads to be used is changed, the first to third coating heads 21 to 23 can perform work almost uniformly from one end to the other end of the first region A1 in the installation direction of the component attaching portions 41. According to the embodiment, the holding position of the printed board 12 when holding the printed board 12 on the conveyors 13 can be determined based on a reference position at or near the center of the first region A1 in the installation direction of the component attaching portions 41. This means that the stop position of the printed board 12 on the conveyors 13 need not be changed when changing the number of coating heads to be used. That is, the embodiment can provide a dispenser (printed board working apparatus) capable of changing the number of coating heads to be used without changing the stop position of the printed board 12.

The dispenser 11 according to the embodiment includes the base member 31 which is detachably attached to the moving member 26 and on which the component attaching portions 41 are arranged. The attaching positions of the first to third coating heads 21 to 23 with respect to the moving member 26 are changed by changing the attaching position of the base member 31 in the installation direction of the component attaching portions 41.

When using a plurality of coating heads, their attaching positions can be changed at once.

Thus, the embodiment can provide a dispenser (printed board working apparatus) capable of easily changing the attaching positions of coating heads. In the dispenser 11 according to the embodiment, the attaching positions of the coating heads can be accurately changed because the interval between the first to third coating heads 21 to 23 does not change.

The dispenser 11 according to the embodiment includes the image sensing device 36 which is arranged on the base member 31 to sense the printed board 12.

The positions of the first to third coating heads 21 to 23 with respect to the image sensing device 36 do not change before and after changing the attaching position of the base member 31. The embodiment can therefore provide a dispenser in which the image sensing device 36 can accurately sense portions having undergone work by the first to third coating heads 21 to 23 even upon changing the attaching position of the base member 31.

The dispenser 11 according to the embodiment includes the measurement device 37 which is arranged on the base member 31 to measure the height of the printed board 12.

The positions of the first to third coating heads 21 to 23 with respect to the measurement device 37 do not change before and after changing the attaching position of the base member 31. Thus, the embodiment can provide a dispenser in which the measurement device 37 can be used to accurately measure the intervals between the first to third coating heads to 23 and the printed boards 12 even upon changing the attaching position of the base member 31.

Second Embodiment

Figure 13:
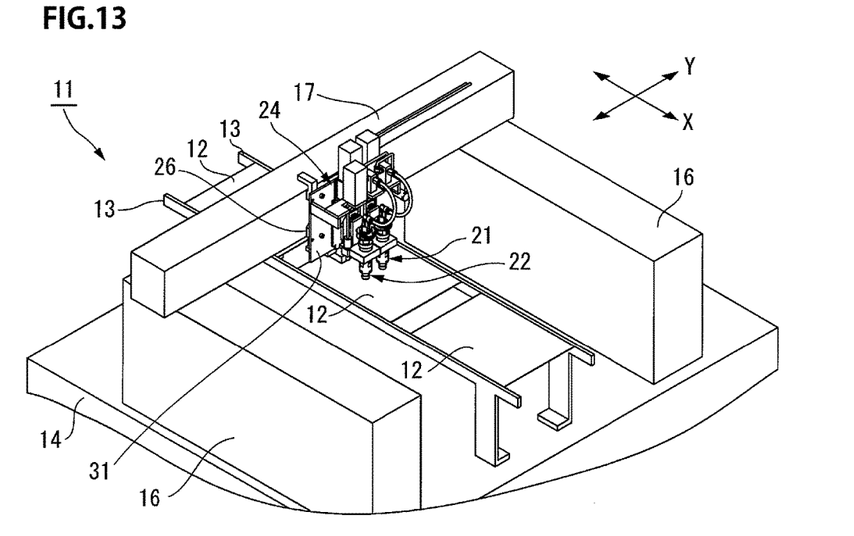
FIG. 13 is a perspective view showing a dispenser including two coating heads according to a second embodiment, in which only fixed rails and a head support member are illustrated as components for supporting a head unit, and the remaining components are not illustrated.
Figure 14:
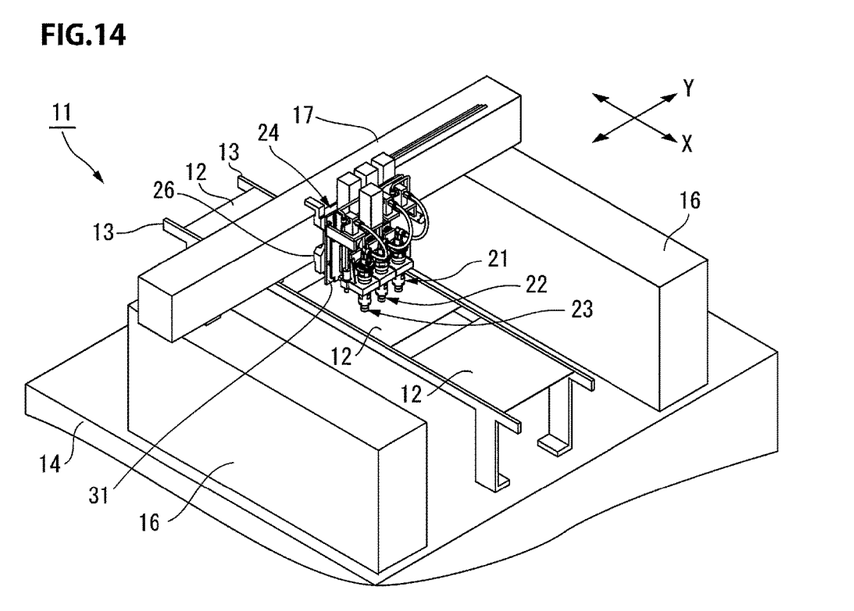
FIG. 14 is a perspective view showing the dispenser including three coating heads according to the second embodiment, in which only the fixed rails and head support member are illustrated as components for supporting the head unit, and the remaining components are not illustrated.

The first embodiment has described an example in which a plurality of working heads (first to third coating heads) are aligned in the printed board transport direction. However, the present invention is applicable to a printed board working apparatus in which a plurality of working heads are aligned in a horizontal direction (Y direction) perpendicular to the printed board transport direction (X direction). This embodiment will be explained in detail with reference to FIGS. 13 and 14. In FIGS. 13 and 14, the same reference numerals as those described with reference to FIGS. 1 to 12 denote the same or equivalent members, and a detailed description thereof will be properly omitted.

A head support member 17 of a dispenser 11 shown in FIGS. 13 and 14 is arranged above conveyors 13 while extending in the Y direction. The head support member 17 is supported on fixed rails 16 extending in the X direction, to be freely movable in the X direction. An X direction driving device (not shown) arranged on the fixed rails 16 drives the head support member 17 to move in the X direction.

The head support member 17 supports a head unit 24 shown in FIGS. 13 and 14 to be freely movable in the Y direction. A Y direction driving device (not shown) arranged on the head support member 17 drives the head unit 24 to move in the Y direction.

A plurality of coating heads 21 to 23 according to the embodiment are attached to a base member 31 so that they are aligned in the Y direction. The base member 31 is detachably attached to a moving member 26. The attaching position of the base member 31 is changeable in the Y direction, similar to the case in which the first embodiment is adopted.

The first and second coating heads 21 and 22 are attached to the base member 31 shown in FIG. 13. A component attaching portion 41 positioned at one end of the base member 31 in the Y direction is in an empty space state in which no coating head is attached. The dispenser 11 shown in FIG. 14 is constituted by attaching the third coating head 23 to the component attaching portion 41 providing an empty space of the base member 31 shown in FIG. 13. Hence, the attaching position of the base member 31 shown in FIG. 14 is changed from the attaching position of the base member 31 shown in FIG. 13 in a direction (rightward in the Y direction in FIG. 14) opposite to a direction in which the third coating head 23 is added in the Y direction.

Even in this form in which the first to third coating heads 21 to 23 are aligned in the Y direction, the Y positions of the first to third coating heads 21 to 23 are changed by changing the attaching position of the base member 31. Therefore, the same effects as those obtained when the first embodiment is employed are obtained.

The first and second embodiments have described an example in which the first to third coating heads 21 to 23 are attached to the moving member 26 via the base member 31. However, the present invention is not limited to this. The first to third coating heads 21 to 23 can be detachably attached to the main body 26a of the moving member 26. In this case, a plurality of component attaching portions 41 are formed on the moving member 26.

The first and second embodiments have described an example in which the present invention is applied to the dispenser. However, the present invention is applicable to another printed board working apparatus, e.g., an electronic component mounting apparatus. The electronic component mounting apparatus mounts electronic components on a printed board. The electronic component mounting apparatus includes a moving member equivalent to the moving member of the dispenser, and suction heads attached to the moving member. Each suction head includes a suction nozzle for sucking an electronic component. To apply the present invention to the electronic component mounting apparatus, the suction head is attached to the component attaching portion of the moving member or the component attaching portion of a base member which moves together with the moving member. The component attaching portion is formed so that the attaching position of the suction head is changeable in a horizontal direction. Even when the present invention is applied to the electronic component mounting apparatus, the same effects as those obtained when the above-described embodiment is adopted are obtained.

According to the present invention, when adding a working head to be used, the attaching position of the working head can be changed in a direction in which the region where no working head can perform work is reduced.

The present invention can therefore provide a printed board working apparatus capable of executing work in a region where no working head can perform work before the attaching position of the working head is changed.

What is claimed is:

1. A printed board working apparatus comprising:
   a transport device configured to transport a printed board in a first horizontal direction;
   a support member which extends in a second horizontal direction above the transport device;
   a moving member which is supported by the support member to be freely movable in the second horizontal direction in a first predetermined range having a moving member range center;
   a base member which is formed into a plate shape and detachably attached on a first plate surface of the base member to the moving member to move together with the moving member as the base member is attached to the moving member; and
   at least one working head which is detachably attached on a second plate surface of the base member, the at least one working head having a first working head center in the second horizontal direction, and the first working head center is movable in a second predetermined range having a first working head range center, the first working head range center positioned within a third predetermined range in which the moving member range center is located, the third predetermined range defined by an area in which every one of the at least one work head is able to perform work,
   wherein the base member is attached to the moving member in one of a plurality of predetermined positions in which the base member is to be attached to the moving member, and the plurality of predetermined positions are aligned in the second horizontal direction,
   the base member includes a plurality of portions on the second plate surface to any of which the working head is attached, and the plurality of portions are aligned in the second horizontal direction as the base member is attached to the moving member,
   a position of the base member to the moving member can be changed in the second horizontal direction by changing the position of the base member from the one of the plurality of predetermined positions to another one of the plurality of predetermined positions,
   after another working head is positioned on the second plate surface of the base member alongside the at least one working head, a second working head center in the horizontal direction is defined by the presence of the another working head, the second working head center movable in a new second predetermined range having a second working head range center, and the position of the second working head range center is outside the third predetermined range, and
   the base member is moved from the one of the plurality of predetermined positions to another one of the plurality of predetermined positions to move the second working head range center from a position outside the third predetermined range to a position within the third predetermined range.

2. An apparatus according to claim 1, further comprising an image sensing device which is arranged on the base member.

3. An apparatus according to claim 2, further comprising a measurement device which is arranged on the base member.

4. An apparatus according to claim 1, further comprising a measurement device which is arranged on the base member.

5. An apparatus according to claim 1, wherein
   a plurality of positioning holes are formed in the moving member to be aligned at a predetermined interval in the second horizontal direction, and
   the base member includes a pin which is fitted in any one of the plurality of positioning holes.

6. An apparatus according to claim 1, wherein
   the first horizontal direction and the second horizontal direction are the same direction.

7. An apparatus according to claim 1, wherein
   the first horizontal direction and the second horizontal direction are perpendicular to each other.

* * * * *